United States Patent [19]
Nauta et al.

[11] Patent Number: 5,640,163
[45] Date of Patent: Jun. 17, 1997

[54] FOLDING STAGE AND FOLDING ANALOG-TO-DIGITAL CONVERTER

[75] Inventors: Bram Nauta; Arnoldus G. W. Venes, both of Eindhoven, Netherlands

[73] Assignee: U.S. Philips Corporation, New York, N.Y.

[21] Appl. No.: 498,074

[22] Filed: Jul. 5, 1995

[30] Foreign Application Priority Data

Jul. 7, 1994 [EP] European Pat. Off. .............. 94201957

[51] Int. Cl.⁶ .................................................. H03M 1/12
[52] U.S. Cl. .................................................. 341/155
[58] Field of Search ........................... 341/155, 159, 341/158, 157

[56] References Cited

U.S. PATENT DOCUMENTS

| | | | |
|---|---|---|---|
| 4,386,339 | 5/1983 | Henry et al. | 340/347 |
| 5,376,937 | 12/1994 | Colleran et al. | 341/159 |

OTHER PUBLICATIONS

"An 8-bit 100-MHz Full-Nyquist Analog-to-Digital Converter" by Rudy J. Van de Plassche et al, IEEE Journal of Solid-State Circuits, vol. 23, No. 6, Dec. 1988, pp. 1334–1344.

"An 8-bit Video ADC Incorporating Folding and Interpolation Techniques" by Rob E.J. Van de Grift et al, IEEE Journal of Solid-State Circuits, vol. SC-22, No. 6, Dec. 1987, pp. 944–953.

*Primary Examiner*—Brian K. Young
*Attorney, Agent, or Firm*—Bernard Franzblau

[57] ABSTRACT

A folding stage for a folding analog-to-digital converter includes a plurality of consecutive reference terminals providing ascending different reference voltages, a first summing node, a second summing node and a first output node. A plurality of differentially coupled transistor pairs wherein each of the pairs has a first transistor having a main current path and a control electrode which is coupled to an input terminal (IT) for receiving an input voltage to be folded and a second transistor having a main current path and a control electrode which is coupled to a respective one of the consecutive reference terminals. The main current path of the first transistor of the consecutive transistor pairs is coupled alternately to the first summing node and the second summing node, and the main current path of the associated second transistor is coupled alternately to the second summing node and the first summing node. A current-to-voltage converter includes a first resistor connected between the first output node and the first summing node to provide a first output voltage.

24 Claims, 10 Drawing Sheets

5,640,163

FOLDING STAGE AND FOLDING ANALOG-TO-DIGITAL CONVERTER

BACKGROUND OF THE INVENTION

This invention relates to a folding stage for a folding analog-to-digital converter, the folding stage comprising:

an input terminal for receiving an input voltage to be folded;

reference means having a plurality of consecutive reference terminals for providing ascending different reference voltages;

a first summing node and a second summing node;

a plurality of differentially coupled transistor pairs, each one of the transistor pairs comprising a current source, a first transistor having a first main electrode coupled to the current source and a control electrode coupled to the input terminal and a second transistor having a first main electrode coupled to the current source and a control electrode coupled to a respective one of the consecutive reference terminals, the second main electrode of the first transistor of consecutive transistor pairs being coupled alternately to the first summing node and to the second summing node, and the second main electrode of the associated second transistor being coupled alternately to the second summing node and to the first summing node; and a first output node; and current-to-voltage converter means comprising a first resistor coupled to the first output node to provide a first output voltage and having an input coupled the first summing node.

The invention also relates to an analog-to-digital (A/D) converter comprising a plurality of such folding stages. Such a folding stage is known from U.S. Pat. No. 4,386,339.

Important considerations in designing an A/D converter are speed, component count and resolution. Full flash converters have a relatively simple architecture. To convert an analog input voltage into an N-bit digital output code, a full flash converter normally employs $2^N-1$ input comparators for comparing the input voltage with $2^N-1$ corresponding reference voltages. The principal disadvantage of the full flash converter is the high component count due to the large number of input comparators. Several schemes have been proposed to reduce the number of components.

The folding technique is one of the schemes for reducing component count. Folding architectures have been successfully implemented in very high speed bipolar A/D converters. See R. van de Grift et al., "An 8-bit Video ADC Incorporating Folding and Interpolating Techniques", IEEE Journal of Solid-State Circuits, Vol. SC-22, No. 6, December 1987, pp 944–953. Also see R. van de Plassche et al., "An 8-bit 100-MHz Full-Nyquist Analog-to Digital Converter", IEEE Journal of Solid-State Circuits, Vol. 23, No. 6, December 1988, pp 1334–1344. The basic principles of the folding architecture are extensively explained in these references. A folding A/D converter comprises a number of folding stages, each comprising a set of differential pairs responding to the input voltage and a corresponding set of reference voltages. The outputs of the differential pairs are combined in such a way as to generate one or more single ended folding signals or pairs of complementary folding signals having a repetitive rounded triangular or sine wave shape as a function of the input voltage. The folding signals of the folding stages are supplied to respective one's of a group of sample latches for converting the folding signals to a group of least significant bits of the digital output code. The most significant bits are supplied by a group of coarse comparators which operate on the input voltage along a separate channel. In this way the number of latches can be reduced considerably. The number of latches is reduced by the number of times the input signal is folded by the folding stages. However, each latch requires its own folding signal and each folding stage requires as many differential pairs as the number of times the signal has been folded. The more efficient use of the latches is therefore offset by an increasing number of differential pairs in the folding stages. As also known from the aforementioned IEEE-references, the number of folding stages can be reduced by interpolating between the folding signals of the folding stages to generate additional folding signals without the need for more folding stages. In this way the interpolation reduces the number of folding stages by the interpolation factor. A combined folding and interpolating architecture results in a compact low-power A/D converter.

A problem axises when the folding stage known from U.S. Pat. No. 4,386,339 is to be used in an interpolating and folding A/D converter architecture. In this known folding stage the collectors of consecutive differential transistor pairs are cross coupled and connected to two summing nodes. The current through each summing node is converted to an output voltage by a current-to-voltage converter consisting of a bipolar summing transistor having its base connected to a fixed bias voltage, its emitter connected to the summing node to form a low-impedance current input and its collector connected to a supply voltage via a load resistor to provide the output voltage. For interpolation a string of impedance elements, preferably resistors, is to be connected between the collectors of two consecutive folding stages. Since the interpolation reduces the amplitude of the interpolated signals, the output voltage at the collectors of the summing transistors should be sufficiently high and therefore the resistance value of the load resistor should be sufficiently high as well. The total resistance of the string of interpolation resistors should be large with respect to the load resistors to avoid heavy shunting of the load resistors. High resistance values are undesirable as they require much considerable area in an integrated circuit and reduce the maximum speed as a consequence of the increased sensitivity to parasitic capacitances.

SUMMARY OF THE INVENTION

It is an object of the invention to provide a folding stage for use in a folding analog-to-digital converter which is less sensitive to the shunting effect of the interpolation elements.

For this purpose the folding stage as specified in the opening paragraph is characterized in that the first resistor is connected between the first summing node and the first output node; and the current-to-voltage converter means comprises a transconductance stage having an inverting input coupled to the first summing node and an output coupled to the first output node.

The output voltage at the first output node is proportional to the resistance R of the first resistor. The input impedance of the transconductance stage is equal to $1/g_m$, $g_m$ being the transconductance of the transconductance stage. The output impedance of the transconductance stage is also $1/g_m$. A large transconductance provides a low output impedance and a large resistance R provides a large output voltage. Contrary to the known current-to-voltage converter means, the output voltage and the output impedance can be designed separately by selecting suitable values for the resistance R of the first resistor and for the transconductance $g_m$ of the transconductance stage. In this way the impedance of the interpolation network can be lowered without decreasing the voltages of the interpolated folding signals. The lower impedance level of the interpolation network is less sensitive to parasitic capacitances and thus allows higher speed.

The two summing nodes of the folding stage need a bias current. Mismatch between the two bias currents causes offset in the output currents of the folding stage. This offset results in non-linearity errors of a folding A/D converter and should be avoided as much as possible. In order to reduce the mismatch of the bias currents an embodiment of the folding stage according to the invention is characterized in that the folding stage further comprises a first bias current source coupled to the first output node for providing a first bias current to the first summing node via the first resistor.

By moving the bias current source from the summing node to the output node, the bias current now flows through the first resistor and an error in the bias current has a factor $g_m R_1$ ($R_1$ is the resistance of the first resistor) less effect. The effect of mismatch can be reduced considerably. A factor 16 is obtained at values of $g_m$=4 mA/V and $R_1$=4 kOhm.

The output voltage of the folding stage can be single ended. A folding stage having a differential output is characterized in that the folding stage further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node, and preferably the folding stage further comprises a second bias current source coupled to the second output node for providing a second bias current to the second summing node via the second resistor.

For high speed applications the generation of differential signals is preferred, since it greatly improves the reliability and robustness of a folding A/D converter under noisy conditions corresponding to a digital environment.

The transconductance stage may be implemented in any suitable way. A simple differential transconductance stage comprising only a few components is characterized in that the transconductance stage comprises a first transistor and a second transistor having first main electrodes coupled to a common current source, having second main electrodes coupled to the first output node and the second output node, respectively, and having control electrodes coupled to the first summing node and the second summing node, respectively.

This differential transconductance stage may be further characterized in that the transconductance stage further comprises a third resistor connected between the first output node and the second summing node and a fourth resistor connected between the second output node and the first summing node.

The third and fourth resistors are cross-coupled and provide a lower DC voltage drop between the summing nodes and the output nodes, while maintaining the same differential signal amplification. For common-mode signals (bias currents) the first and third resistors are seen in parallel; the same holds for the second and fourth resistors. For differential mode (signal currents) the first and third resistors are seen in parallel with a minus sign for the third resistor, thereby effectively increasing the parallel resistance; the same holds for the second and fourth resistors.

As already said, the folding stage according to the invention is very suitable for use in a folding A/D converter with interpolation. According to the invention a folding analog-to-digital converter is characterized by comprising:

an input terminal for receiving an input voltage to be converted;

reference means having a plurality of consecutive reference terminals for providing ascending different reference voltages;

a plurality of folding stages, each folding stage comprising:

a first summing node and a second summing node;

a plurality of differentially coupled transistor pairs, each one of the pairs comprising a current source, a first transistor having a first main electrode coupled to the current source and a control electrode coupled to the input terminal and a second transistor having a first main electrode coupled to the current source and a control electrode coupled to a respective one of the consecutive reference terminals, the second main electrode of the first transistor of consecutive transistor pairs being coupled alternately to the first summing node and the second summing node, and the second main electrode of the associated second transistor being coupled alternately to the second summing node and the first summing node;

a first output node;

current-to-voltage converter means comprising a first resistor connected between the first summing node and the first output node to provide a first output voltage and having an input coupled the first summing node and a transconductance stage having an inverting input coupled to the first summing node and an output coupled to the first output node;

and a first interpolation network comprising a string of impedance elements interconnected in main string nodes, the main string nodes being connected to respective first output nodes of the folding stages, each one of the impedance elements being comprised of a substring of impedance elements interconnected in substring nodes for providing interpolated versions of voltages at the first output nodes.

The individual folding stages may have single ended or differential outputs. In the latter case the analog-to-digital converter may be further characterized in that the first interpolation network comprises a further string of further impedance elements interconnected in further main string nodes, the further main string nodes being connected to respective second output nodes of the folding stages, each one of the further impedance elements being comprised of a further substring of further impedance elements interconnected in further substring nodes for providing interpolated versions of voltages at the second output nodes.

In this way a differential interpolating system is obtained with better performance in noisy digital environments.

BRIEF DESCRIPTION OF THE DRAWING

The above and other features and advantages of the invention will be apparent from the following description of exemplary embodiments of the invention with reference to the accompanying drawings, in which.

Like reference symbols are employed in the drawings and in the description of the preferred embodiments to represent the same or very similar item or items.

DESCRIPTION OF THE PREFERRED EMBODIMENTS

Figure 1:
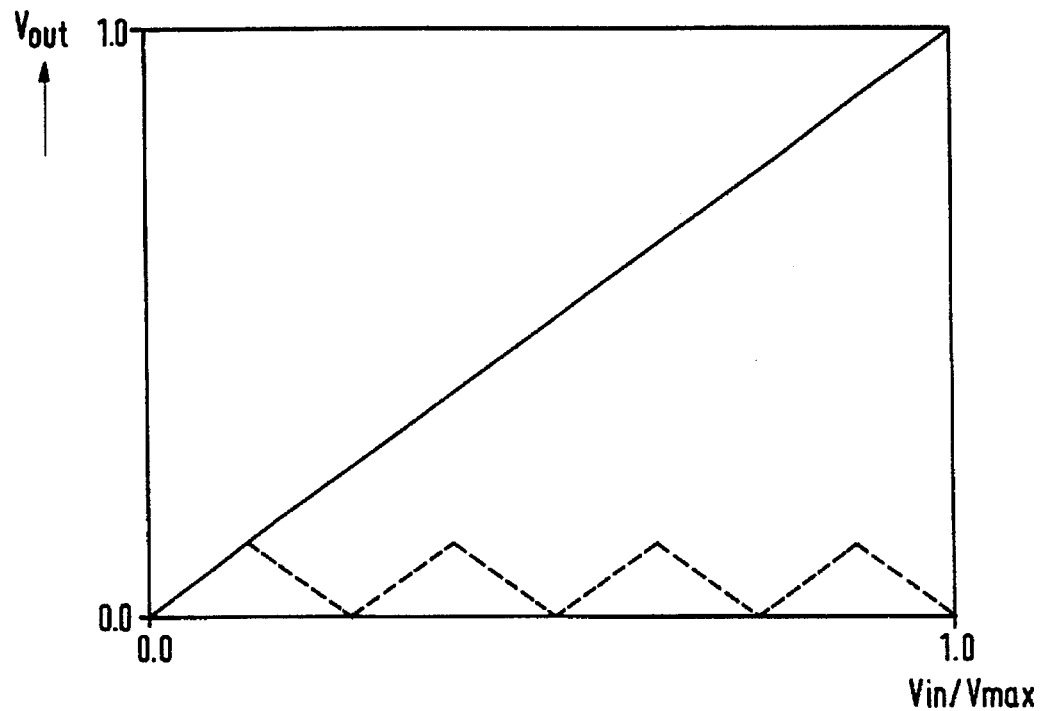
FIG. 1 is a diagram showing input signal conversion in a flash and a folding A/D converter architecture.

As an example the function of an 8-bit folding and interpolating analog-to-digital (A/D) converter will be described. The converter converts an analog input signal $V_{in}$ to a 256 level digital (binary) output code. With a flash converter, this 256 level output code is generated by comparison of the input signal with 256 reference levels. So, 256 comparators are needed in a flash A/D converter architecture. Referring to FIG. 1, conversion to the digital output code in the flash converter is performed by comparing the drawn input signal in 256 comparators with a corresponding number of reference levels. A folding architecture generates the output code with a quite different approach. The input voltage $V_{in}$ is folded in the folding stage as indicated by the dashed line. The folded input signal incorporates four up going edges and four down going edges and the amplitude range of the folded signal is reduced to one eighth of the amplitude range of original input signal. This folded signal is called an eight times folding signal. Obviously, the folding rate of the folding signal could be, for example, two, four or sixteen as well.

Assuming that it is registered which of the folding edges corresponds with the input signal. This information can be converted to an 8 level, 3 bit coarse digital output code. Now, in the folding signal a 32 level output code has to be distinguished to complete the output coding. This can be performed with only 32 latches or comparators. The main advantage of the folding architecture compared to a flash architecture so far is a reduction in latch/comparator count: from 256 comparators in a flash architecture to 32 in the folding architecture. A drawback of this folding system is that the frequency of the folding signal will be a multiple of the input signal. For the eight times folding signal in FIG. 1 the highest signal frequency is $8*(\pi/2)$ times the input signal frequency. At the desired high speed video operation this leads to rounding of the tops in the triangle shaped folding signal. A double folding system could solve this rounding problem.

Figure 2:
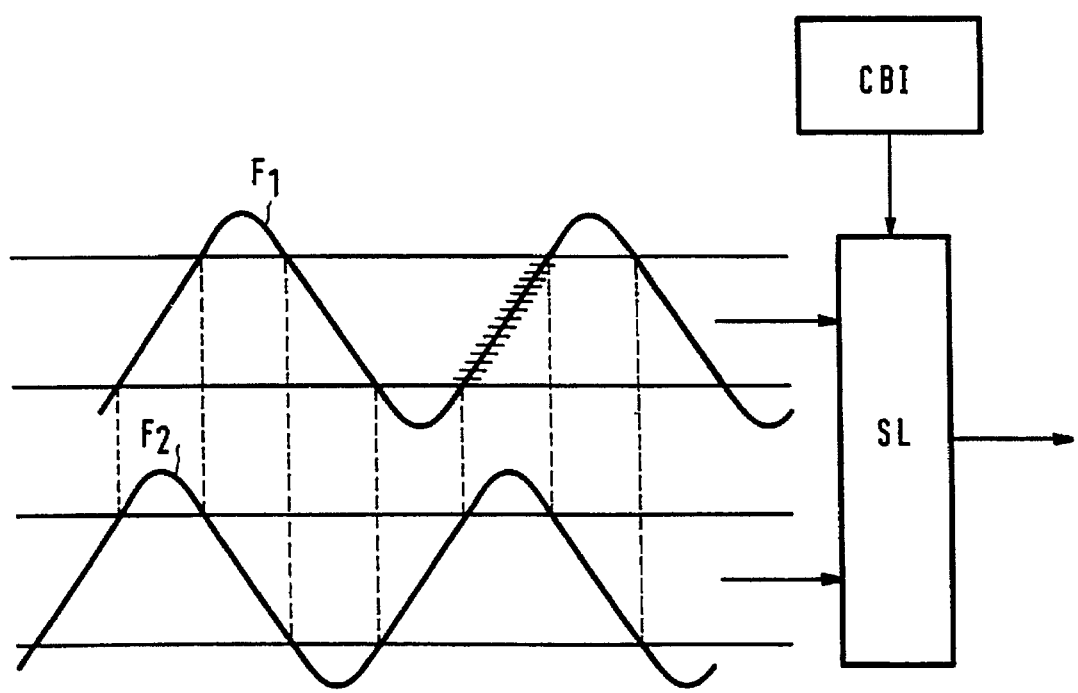
FIG. 2 is a diagram showing twin folding signal generation in a double folding A/D converter architecture.

FIG. 2 shows a block diagram of a double folding system. The information around the tops of the folding signals $F_1$ and $F_2$ can be discarded, because for any input signal level one of the two folding signals will be in its linear region. Selection logic SL selects the right folding signal in response to a coarse bit information unit CBI and in the linear region of the selected folding signal only 16 levels need to be distinguished. This process of adding folding signals to reduce the number of levels to be distinguished can be repeated. Finally, a system with 32 folding signals can be constructed. With 32 folding signals only one level has to be distinguished from each folding signal. The only information to be gathered is whether the folding signal is positive or negative, so only the zerocrossings in the folding signals are of main importance.

Figure 3:
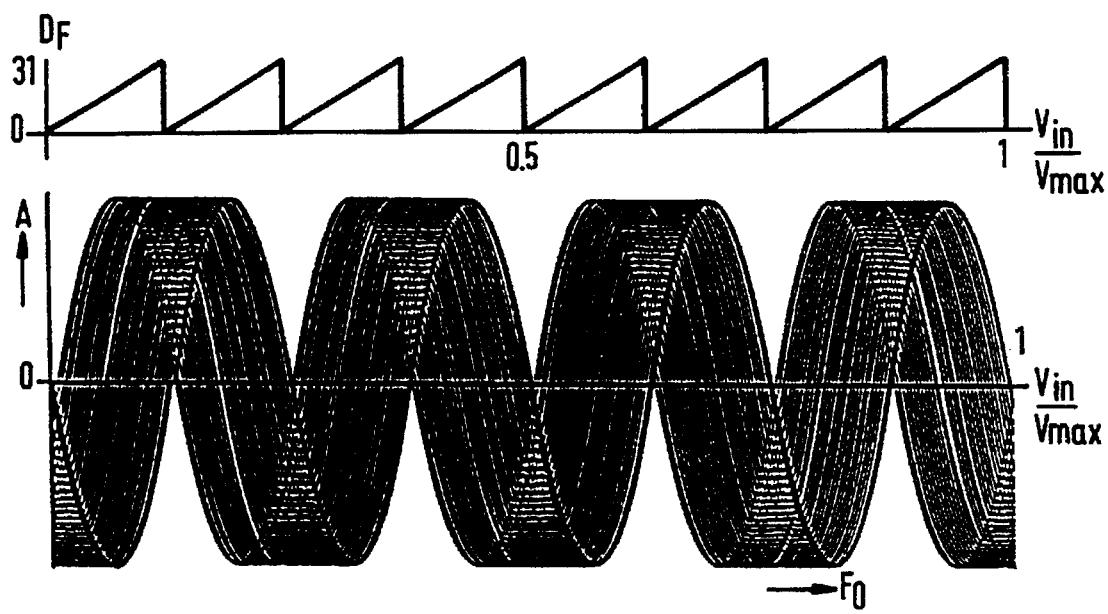
FIG. 3 shows waveforms of 32 eight times folding signals occurring in a folding A/D converter according to the invention.

FIG. 3 shows 32 eight times folding signals. The thick curve of folding signal $F_0$ has nine zerocrossings since this signal $F_0$ both marks the minimum and maximum input signal $V_{in}$. The other 31 folding signals have eight zerocrossings. With 32 folding signals $8*32=256$ zerocrossings can be marked.

Figure 4:
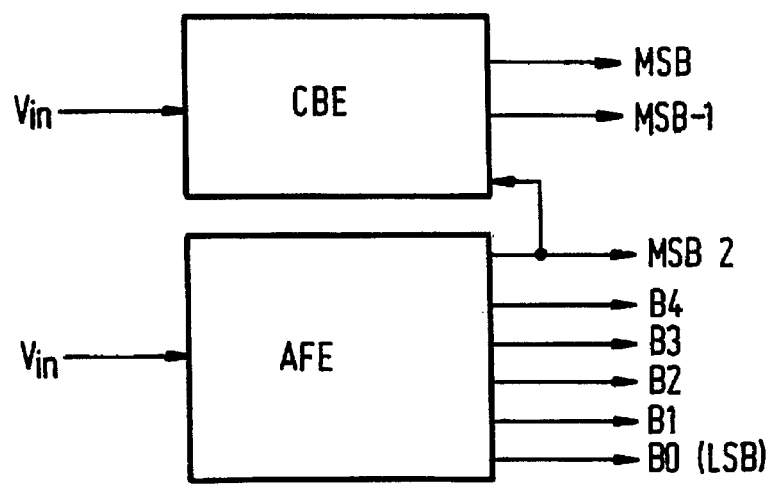
FIG. 4 shows a block diagram of the architecture of a folding A/D converter according to the invention.

FIG. 4 shows how the eight desired output code bits are obtained in the folding A/D converter. A coarse bit generation and encoding block CBE generates the MSB (most significant) and MSB-1 bits and an analog folding preprocessing and fine encoding block AFE generates the third coarse bit MSB-2. Another five fine bits B0 to B4 are derived from the 32 folding signals. B0 is the least significant bit (LSB). The zerocrossings of the folding signal $F_0$ from FIG. 3 mark the transitions of the MSB-2 bit. To link this 32 folding signal system to the folding principle in FIG. 1: the zerocrossings of the folding signal $F_0$ correspond to the bottom and topmost points in the dashed triangle shaped folding signal of FIG. 1. The 32 level code in each edge will be derived from the 31 equidistant zerocrossings from the other 31 folding signals. Each zerocrossing defines a single LSB increase in the input voltage $V_{in}$. The analog contribution of the five fine bits derived from the analog folding preprocessing is shown by signal $D_F$ in FIG. 3.

As stated before the actual shape of the folding signals does not matter; the information in the folding signals is merely its absolute value. As long as the folding signal is not affected in a region around the zerocrossing, the performance of the folding A/D converter will not be influenced. As a result, rounding in the folding signals at high speed operation will not deteriorate system performance.

One folding signal incorporates eight zerocrossings and as a result only 32 comparators or latches are needed to convert the folding signals to their digital representatives. The 32 folding signals each generate 8 zerocrossings. However, by generation of 16, 64 or 128 folding signals an architecture based on folding rates of 16, 4 or 2 would be possible. The maximum internal frequency $F_{int,max}$ in the analog folding preprocessing part equals:

$$F_{int,max} = (\pi/2) * F_{in,max} * FR \qquad (1)$$

$F_{in,max}$ is the maximum input frequency in the input voltage $V_{in}$ and FR is the folding rate of the system. The actual internal frequency is related both to the input frequency and the amplitude of the input signal $V_{in}$. An 8 times folding system requires a 125 MHz bandwidth at an input frequency $F_{in,max}=10$ MHz, twice the bandwidth of a four times folding system.

The number of comparators (NC), or latches, depends directly on the folding rate:

$$NC = 256/FR \qquad (2)$$

A number of 64 comparators is needed in case of a four times folding system. Only half that number is needed with eight times folding, yielding a considerable reduction in power dissipation and chip die size. A folding rate of two would require 128 comparators/latches, which consumes too much power. A sixteen times folding system would reduce the power even more, but the internal frequencies involved may be too high for actual CMOS implementation.

Figure 5:
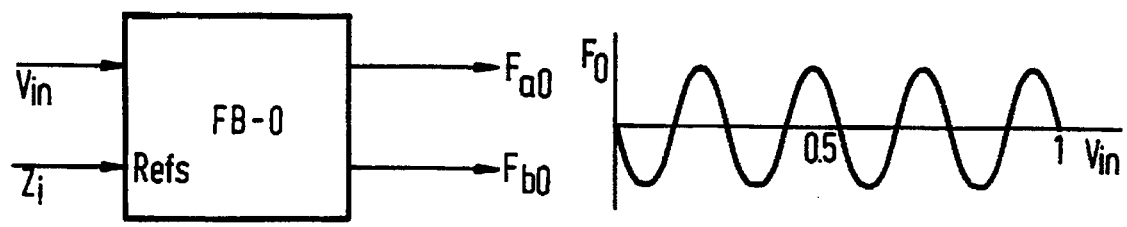
FIG. 5 shows a block diagram of a folding stage and its associated folding signal used in a folding A/D converter according to the invention.

FIG. 5 shows the folding stage FB-0 which generates the afore-mentioned folding signal $F_0$. The folding signal $F_0$ is represented by the differential output currents $F_{a0}$ and $F_{b0}$:

$$F_0 = F_{a0} - F_{b0} \qquad (3)$$

For high speed A/D conversion, generation of differential signals is highly preferred. When the A/D converter is embedded in, for example, a noisy digital signal processor, differential operation greatly improves the reliability and robustness. The folding signal $F_0$ has its zerocrossings $Z_i$ at input voltage $V_{in}$ values:

$$Z_i = i * (V_{rng}/8); i=0 \ldots 8 \qquad (4)$$

$V_{rng}$ being the input voltage range. The triangle shaped folding signal from FIG. 1 has the shape of a sine wave in the actual folding stage realisation. But as stated before, the tops of the folding signal do not contain any important information.

Figure 6:
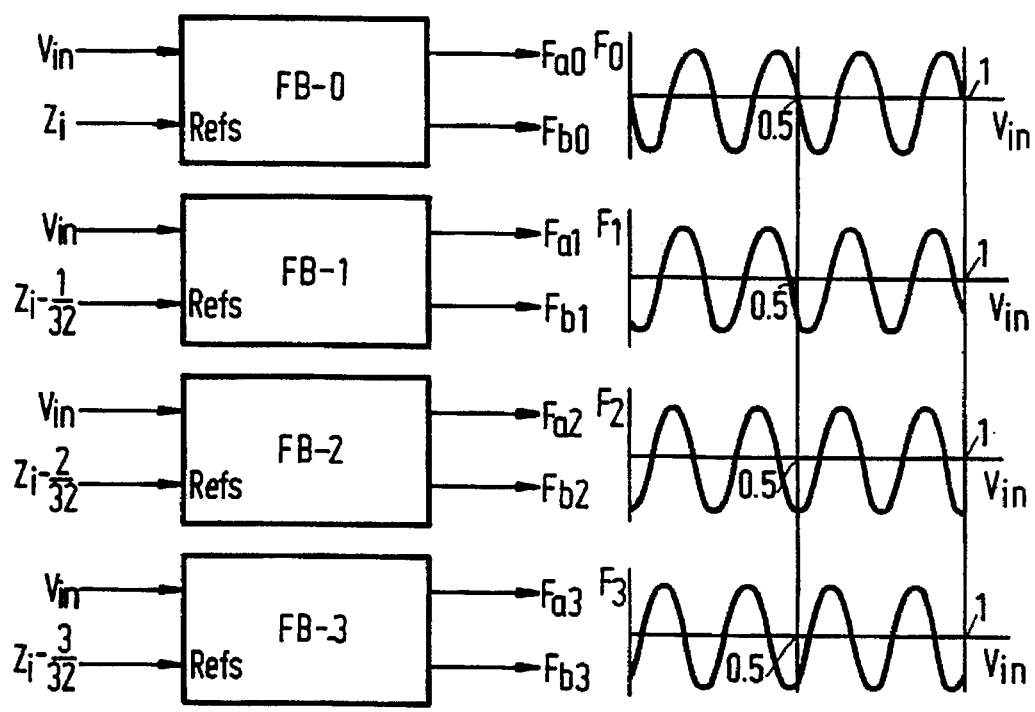
FIG. 6 shows four folding stages and their associated folding signals, used in a folding A/D converter according to the invention.

FIG. 6 shows four folding stages FB-0, FB-1, FB-2 and FB-3 operating in parallel. By adding three folding stages FB-1, FB-2 and FB-3 to folding stage FB-0, four folding signals $F_0$, $F_1$, $F_2$ and $F_3$ are available from folding stages FB-0, FB-1, FB-2 and FB-3, respectively. The zerocrossings of folding signal $F_i$ have been shifted along the $V_{in}$ axis over a distance $-(1/32)V_{rng}$ with respect to the zerocrossings of folding signal $F_0$. Analogously, the zerocrossings of folding signal $F_2$ have been shifted over a distance $-(2/32)V_{rng}$ and the zerocrossings of folding signal $F_3$ over a distance $-(3/32)V_{rng}$. Generation of the desired 28 other folding signals is performed by resistive interpolation.

The required number of 32 folding signals could be generated by using 32 folding stages in parallel, but the complexity of the folding system would be not less than the complexity of a full flash converter. Interpolation is a convenient way to generate the 28 missing signals from the available 4 folding signals.

Figure 7:
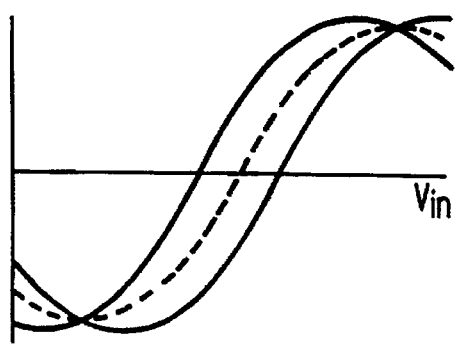
FIG. 7 shows waveforms illustrating the generation of missing folding signals by interpolation.

FIG. 7 shows the principle of generation of a missing folding signal (dashed curve) from two available folding signals (drawn curves) by means of interpolation between the two available folding signals. Interpolation is performed preferably by means of resistors as this does not result in additional power dissipation and the chip area occupied by the resistors is small, particularly compared with capacitive interpolation.

Figure 8:
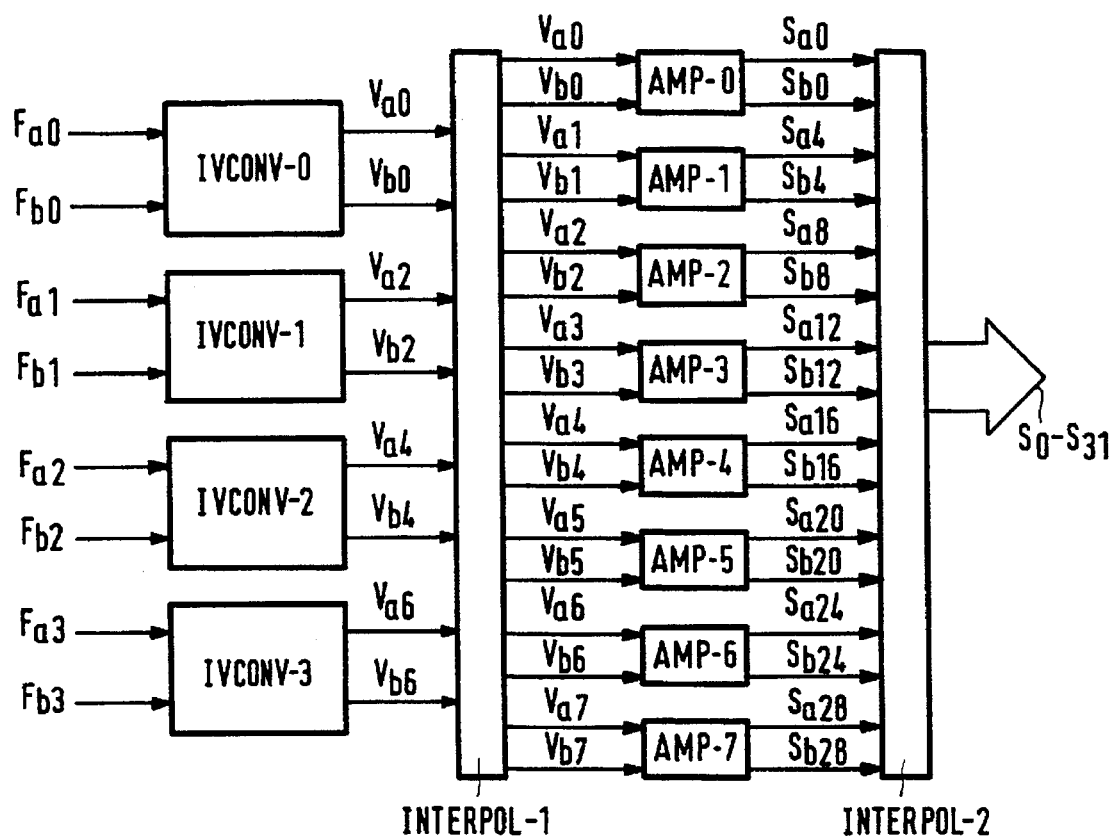
FIG. 8 shows a block diagram of a two stage interpolation system used in an A/D converter according to the invention.

FIG. 8 shows a block diagram of the interpolation system. It is a two stage interpolation system consisting of a cascade of a group of four current-to-voltage converters IVCONV-0, IVCONV-1, IVCONV-2 and IVCONV-3, a first two times interpolation network INTERPOL-1, a group of eight amplifiers AMP-0 to AMP-7 and a four times interpolation network INTERPOL-2. The current-to voltage converters perform the transformation of the differential folding currents $F_{a0}-F_{b0}$, $F_{a1}-F_{b1}$, $F_{a2}-F_{b2}$ and $F_{a3}-F_{b3}$ from the folding stages FB-0 to FB-3 to differential voltage pairs $V_{a0}-V_{b0}$, $V_{a2}-V_{b2}$, $V_{a4}-V_{b4}$ and $V_{a6}-V_{b6}$, respectively. The two times interpolation network INTERPOL-I provides eight differential voltage pairs $V_{a0}-V_{b0}$, $V_{a1}-V_{b1}$, $V_{a2}-V_{b2}$, $V_{a3}-V_{b3}$, $V_{a4}-V_{b4}$, $V_{a5}-V_{b5}$, $V_{a6}-V_{b6}$ and $V_{a7}-V_{b7}$, which are amplified by the eight amplifiers which in turn provide eight amplified differential voltage pairs $S_{a0}-S_{b0}$, $S_{a4}-S_{b4}$, $S_{a8}-S_{b8}$, $S_{a12}-S_{b12}$, $S_{a16}-S_{b16}$, $S_{a20}-S_{b20}$, $S_{a24}-S_{b24}$ and $S_{a28}-S_{b28}$. The amplification assures a reliable 1–0 decision in the next stages. The four times interpolation network INTERPOL-2 generates the desired 32 differential folding signals $S_{a0}-S_{b0} \ldots S_{a31}-S_{b31}$.

Figure 9:
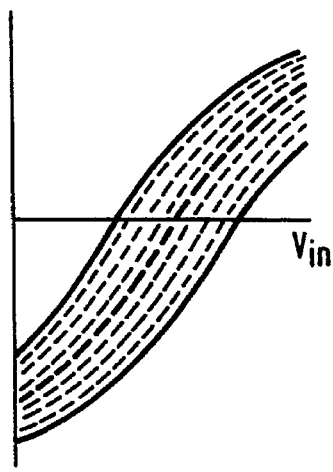
FIG. 9 shows waveforms illustrating the generation of missing folding signals in a two stage interpolation system.

The distributed interpolation in two cascaded interpolation networks is convenient and the associated signal waveforms are shown in FIG. 9. The signals from the current-to-voltage converters correspond to the drawn curves, the signals from the first interpolation network follow the dashed curve and the signals from the second interpolation network follow the dotted curves.

The processing and encoding of the 32 folding signals may be performed in any conventional way, for example as known from the afore-mentioned IEEE-references.

Figure 10:
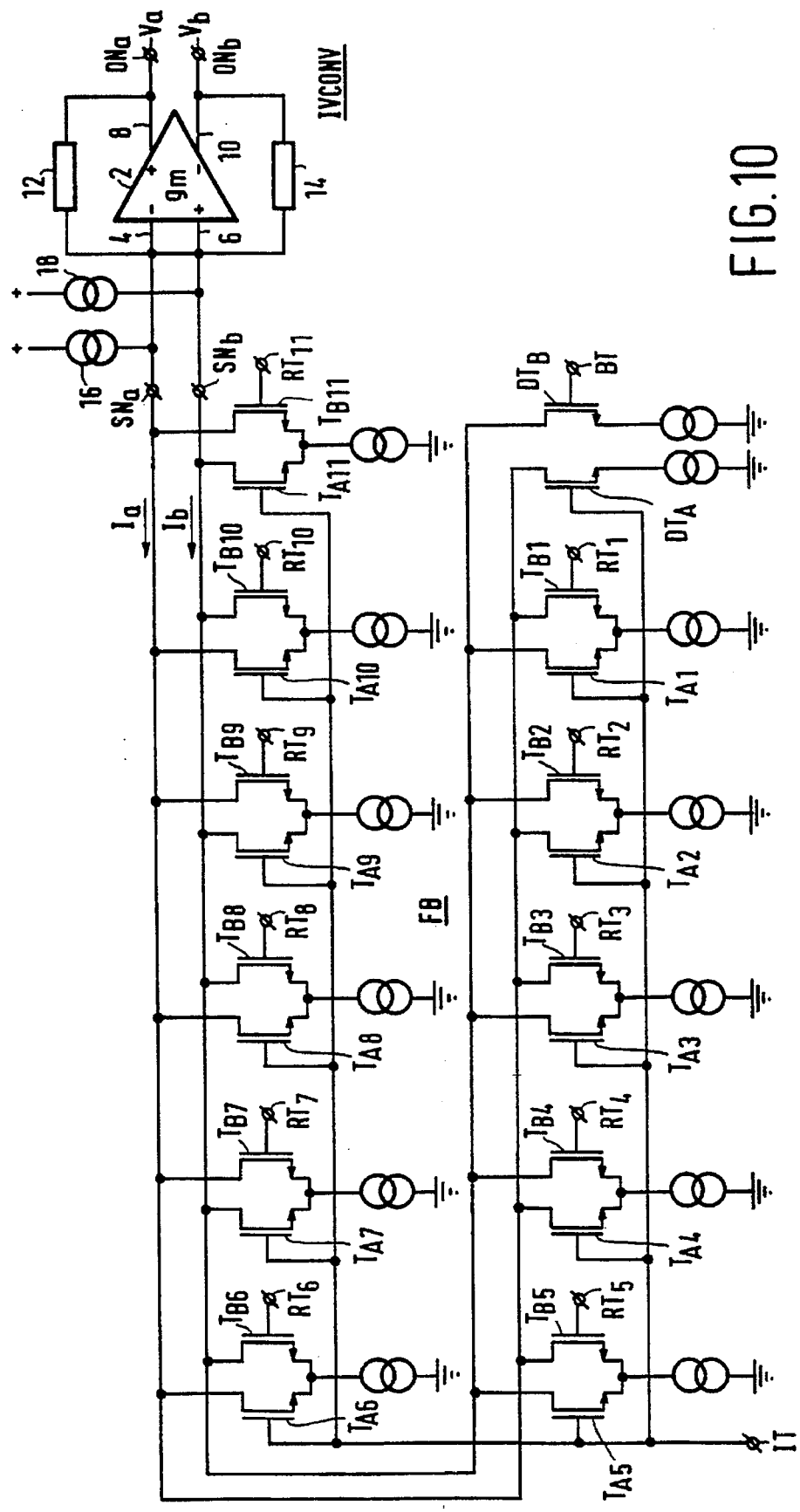
FIG. 10 shows a circuit diagram of a first embodiment of a folding stage according to the invention.

FIG. 10 shows an eight times folding stage FB with unipolar MOS transistors. However, bipolar transistors can be used as well. The control electrode, first main electrode and second main electrode correspond to the gate, source and drain, respectively, of an unipolar transistor and to the base, emitter and collector, respectively, of a bipolar transistor. The folding stage FB has an input terminal IT for receiving the input voltage $V_{in}$. Reference means are provided with eleven reference terminals $RT_1 \ldots RT_{11}$ for providing eleven ascending different reference voltages. Since there are four folding stages FB-0 to FB-3, the reference means generate 4*11=44 different reference voltages. The folding stages are connected to the reference voltages in a fashion as shown in FIG. 6, i.e. all eleven reference voltages of folding stage FB-1 are shifted $-(1/32)$ $V_{rng}$, etc. A conventional resistor ladder can be used for this purpose. The folding stage FB further has a first summing node $SN_a$, a second summing node $SN_b$, eleven differentially coupled transistor pairs and a dummy structure consisting of a first dummy transistor $DT_A$ and a second dummy transistor $DT_B$. Each differential pair comprises a first transistor $T_{Ai}$ having a gate coupled to the input terminal IT and a second transistor $T_{Bi}$ having a gate coupled to a respective one $RT_i$ of the consecutive reference terminals. The main current path of the first transistor $T_{Ai}$ of consecutive transistor pairs is coupled alternately to the first summing node $SN_a$ and the second summing node $SN_b$. The main current path of the other transistor $T_{Bi}$ of the pair is coupled alternately to the second summing node $SN_b$ and the first summing node $SN_a$. In all differential transistor pairs the sources of the first and second transistors are interconnected and coupled to a current source. The gate, drain and source of the first dummy transistor $DT_A$ are connected to, respectively, the input terminal IT, the first summing node $SN_a$ and a current source similar to the current sources of the differential transistor pairs. The gate, drain and source of the second dummy transistor $DT_B$ are connected to, respectively, a bias voltage terminal BT for receiving a suitable fixed bias voltage, the second summing node $SN_b$ and a current source similar to the current sources of the differential transistor pairs.

The folding stage generates an eight times folding signal by means of eleven differential transistor pairs and the dummy structure. In case of folding stage FB-0 nine and in case of folding stages FB-1, FB-2 and FB-3 eight differential transistor pairs are needed to generate the zerocrossings $Z_i$ from equation 4 above. The other two, respectively three differential transistor pairs are optional and may be deleted. The two and three differential transistor pairs generate void zerocrossings at $(1/8)*V_{mg}$ outside the region of the input voltage $V_{in}$. By this extension of the folding structure outside the input voltage range, all valid differential transistor pair transfer curves are equally influenced by the transfer curves of their adjacent differential transistor pairs and accuracy of the folding system is improved. The dummy structure is also optional and may be deleted. It reduces the capacitive error current in the differential output current $I_a-I_b$ caused by the gate-source capacitances and the junction capacitance at the common source node of the transistors in the differential transistor pairs and improves the accuracy of the folding system.

High speed excitation of the folding stage FB introduces disadvantageous effects. As explained before, a full swing 10 MHz sine wave input signal $V_{in}$ leads to an internal frequency of 125 MHz in the output currents $I_a$ and $I_b$. Parasitic capacitances of the transistors $T_{Ai}$ and $T_{Bi}$ of the differential pairs may deteriorate the output currents $I_a$ and $I_b$. The currents through the parasitic capacitances can be relatively large compared to the differential current swing and may reduce the accuracy below true 8-bit performance. It is therefore advantageous to keep the voltage swing at the summing nodes $SN_a$ and $SN_b$ as small as possible to prevent unacceptable capacitive currents through the parasitic capacitances. For this purpose a current-to-voltage converter IVCONV is connected to the summing nodes $SN_a$ and $SN_b$. The current-to-voltage converter IVCONV is a balanced transconductance stage 2 having an inverting input 4 connected to the first summing node $SN_a$, a non-inverting input 6 connected to the second summing node $SN_b$, a non-inverting output 8 connected to a first output node $ON_a$ and an inverting output 10 connected to a second output node $ON_b$. A first resistor 12 is connected between the first summing node $SN_a$ and the first output node $ON_a$ and a second resistor 14 is connected between the second summing node $SN_b$ and the second output node $ON_b$. The transconductance stage 2 has a transconductance $g_m$, which means that the ratio between the differential output current flowing in the outputs 8 and 10 and the differential input voltage over the inputs 4 and 6 is equal to $g_m$. The input impedance and the output impedance of the current-to-voltage converter IVCONV are both equal to $1/g_m$. The voltage gain of the current-to-voltage converter IVCONV is proportional to the resistance R of the first and second resistors 12 and 14 and output voltages $V_a$ and $V_b$ are provided at output nodes $ON_a$ and $ON_b$. As mentioned before and shown in FIG. 8, for interpolation a string of impedance elements, preferably resistors, is to be connected between the corresponding output nodes of two consecutive folding stages. Since the interpolation reduces the amplitude of the interpolated signals, the output voltage at the output nodes should be sufficiently high. The current-to-voltage converter IVCONV enables a separate design of the output voltage swing at the output nodes $SN_a$ and $SN_b$ and the output impedance by selecting suitable values for the resistance R of the first and second resistors 12, 14 and for the transconductance $g_m$ of the transconductance stage 2. In this way the impedance of the interpolation network be kept low without decreasing the voltages of the interpolated folding signals. A low impedance level of the interpolation network is less sensitive to parasitic capacitances and thus allows higher speed.

It is to be noted that the current-to-voltage converter IVCONV can also be a single ended version. In that case, for example, resistor 14 and the inverting output 10 are omitted and non-inverting input 6 is coupled to a suitable bias voltage.

Figure 11:
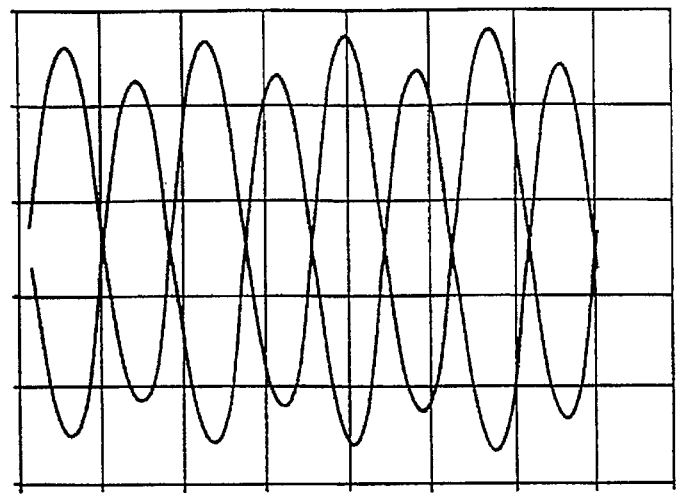
FIG. 11 shows waveforms of output signals of a folding stage with mismatch in the bias currents.
Figure 13A:
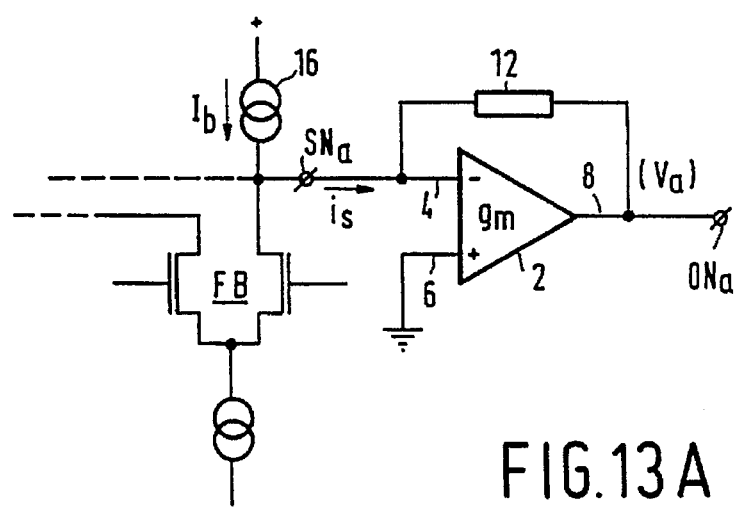
FIG. 13A and FIG. 13B show circuit details of the first and second embodiments of a folding stage according to the invention.
Figure 13B:
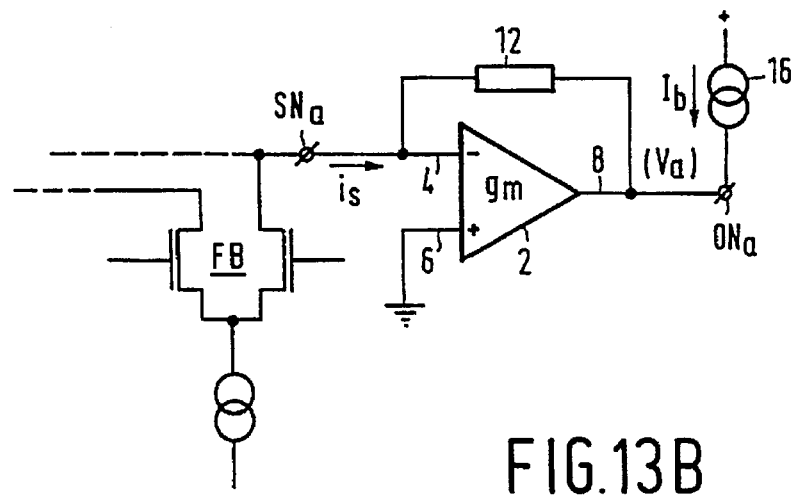
Figure 12:
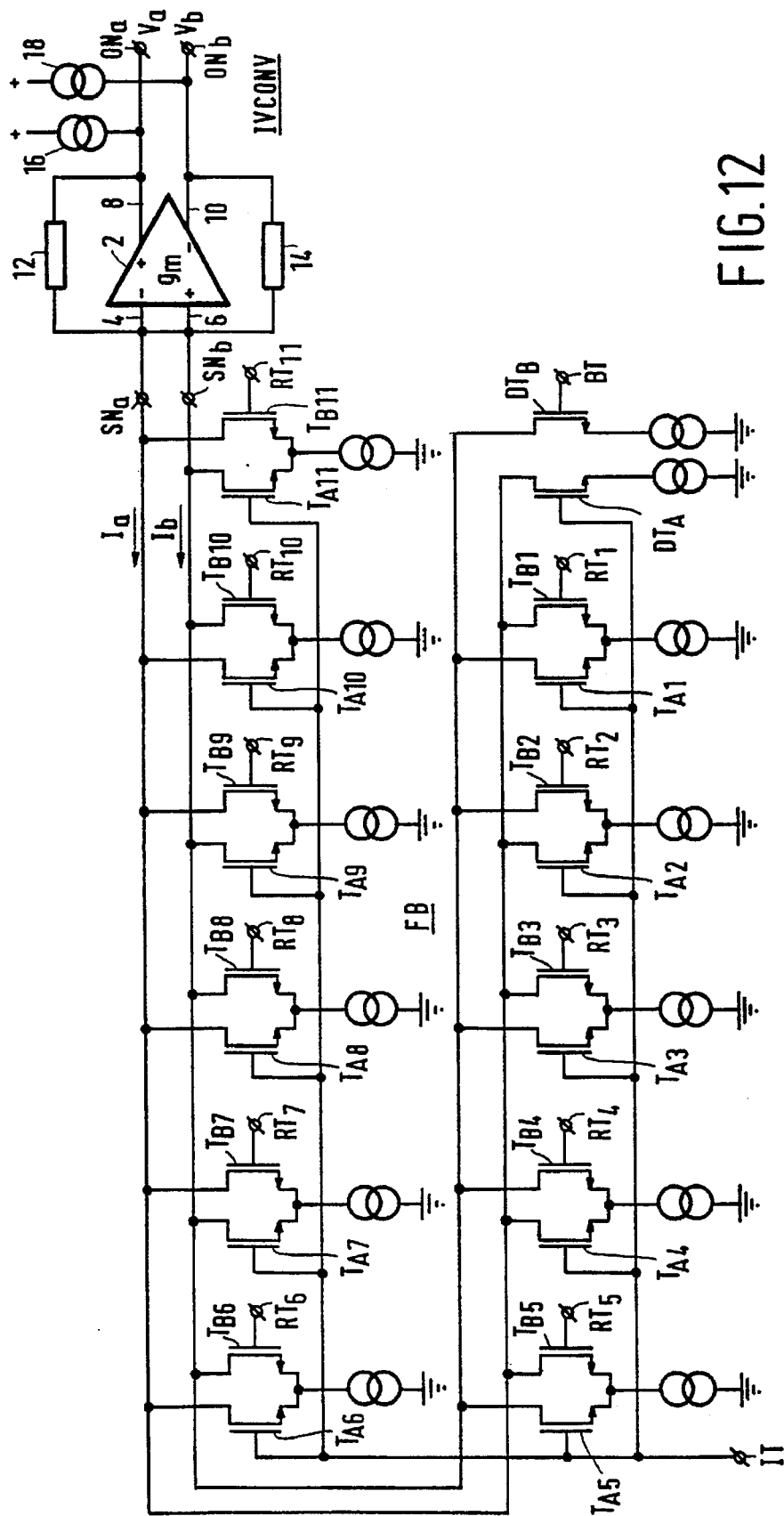
FIG. 12 shows a circuit diagram of a second embodiment of a folding stage according to the invention.

The differential transistor pairs of the folding stage FB need DC bias current. Two bias current sources are provided for this purpose. A first bias current source 16 is connected to the first summing node $SN_a$ and a second bias current source 18 is connected to the second summing node $SN_b$. However, mismatch between the two bias current sources causes offset in the output currents of the folding stage FB and non-linearity errors in the A/D conversion. FIG. 11 shows the effect of this offset in the signal waveforms of $V_a$ and $V_b$. The effect of the mismatch can be reduced by moving the bias current sources from the summing nodes $SN_a$, $SN_b$ to the output nodes $ON_a$ and $ON_b$ as shown in FIG. 12. This is illustrated in FIGS. 13A and 13B where for simplicity reasons only a single ended version of the circuitry is drawn. A signal current $i_s$ flows from the folding stage to the current-to-voltage converter. Consider the bias current $I_b$ of bias current source 16 in FIG. 13A has a certain mismatch $\delta I_b$ in respect of its nominal value $I_{b,nom}$:

$$I_b = I_{b,nom} + \delta I_b \tag{5}$$

The output voltage $V_{a,A}$ at the output node $ON_a$ can be written in the form:

$$V_{a,A} = -i_s R - \delta I_b R = V_{a,nom} + \delta V_{a,A} \tag{6}$$

$V_{a,nom}$ is the nominal output voltage and R the resistance of resistor 12. Consider now FIG. 13B, where the bias current source 16 is moved from the summing node $SN_a$ to the output node $ON_a$. The bias current for the folding stage FB now flows through the resistor 12. Mismatch in the current $I_b$ of current source 16 results in an offset voltage of the transconductance stage 2 which is added to the nominal output voltage $V_{a,nom}$:

$$V_{a,B} = -i_s R - (\delta I_b)/g_m = V_{a,nom} + \delta V_{a,B} \tag{7}$$

Comparing equations 6 and 7 it can be seen that an error $\delta I_b$ in the bias current $I_b$ has a factor $g_m R$ less effect in the configuration of FIG. 13B.

Figure 14:
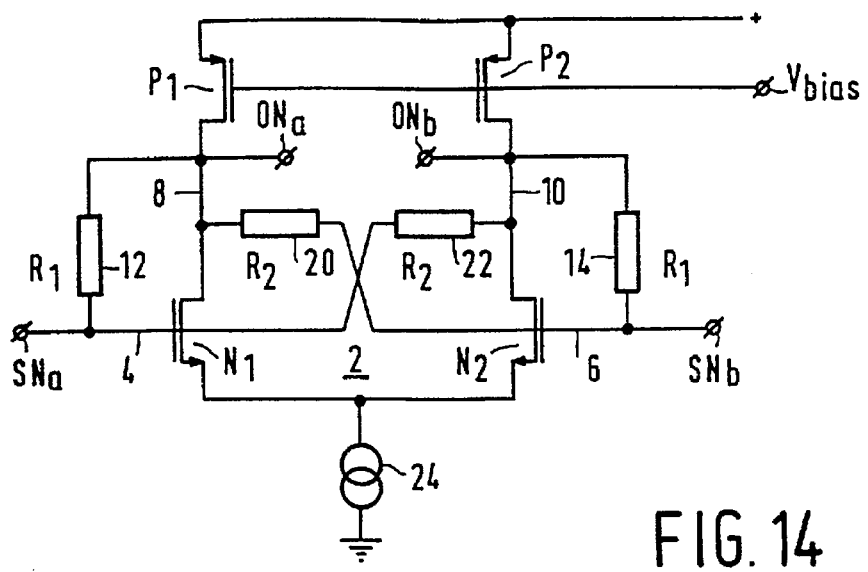
FIG. 14 shows a circuit diagram of a current-to-voltage converter for use in a folding stage according to the invention.

FIG. 14 shows a practical implementation of the current-to-voltage converter IVCONV. A differential transistor pair has first and second N-channel transistors $N_1$, $N_2$ having sources coupled to ground via a common bias current source 24. The gate of transistor $N_1$ is the inverting input 4 which is connected to the first summing node $SN_a$, the gate of transistor $N_2$ is the inverting input 6 which is connected to the second summing node $SN_b$, the drain of transistor $N_1$ is the non-inverting output 8 which is connected to the fist output node $ON_a$ and the drain of transistor $N_2$ is the inverting output 10 which is connected to the second output node $ON_b$. The drain of a P-channel transistor $P_1$ is connected to the drain of transistor $N_1$ and provides bias current to transistor $N_1$ and via resistor 12 to the summing node $SN_a$ of the folding stage. Similarly a P-channel transistor $P_2$ provides bias current to transistor $N_2$ and via resistor 14 to the summing node $SN_b$ of the folding stage. The sources of transistors $P_1$ and $P_2$ are connected to a suitable positive supply voltage, whereas the gates are connected to a suitable bias voltage $V_{bias}$. Optionally two cross-coupled resistors may be added. A first cross-coupled resistor 20 is connected between the drain of transistor $N_1$ and the gate of transistor $N_2$. A second cross-coupled resistor 22 is connected between the drain of transistor $N_2$ and the gate of transistor $N_1$. The advantage is a lower DC voltage drop between the output nodes $ON_a$, $ON_b$ and the summing nodes $SN_a$, $SN_b$, while maintaining differential signal amplification. For common-mode signals (bias currents) the resistors 12 and 22 are seen in parallel and also the resistors 14 and 20 are seen in parallel:

$$\text{common mode}: R_{par} = (R_1 R_2)/(R_1 + R_2) \tag{8}$$

$R_1$ is the resistance of resistors 12 and 14 and $R_2$ is the resistance of resistors 20 and 22. For differential mode signals (signal currents) the resistors are again seen in parallel, but now with a minus sign for the cross-coupled resistors 20, 22:

$$\text{differential mode}: R_{par} = -(R_1 R_2)/(R_1 - R_2) \tag{9}$$

In this way a low common mode gain and a high differential mode gain can be obtained.

Figure 15:
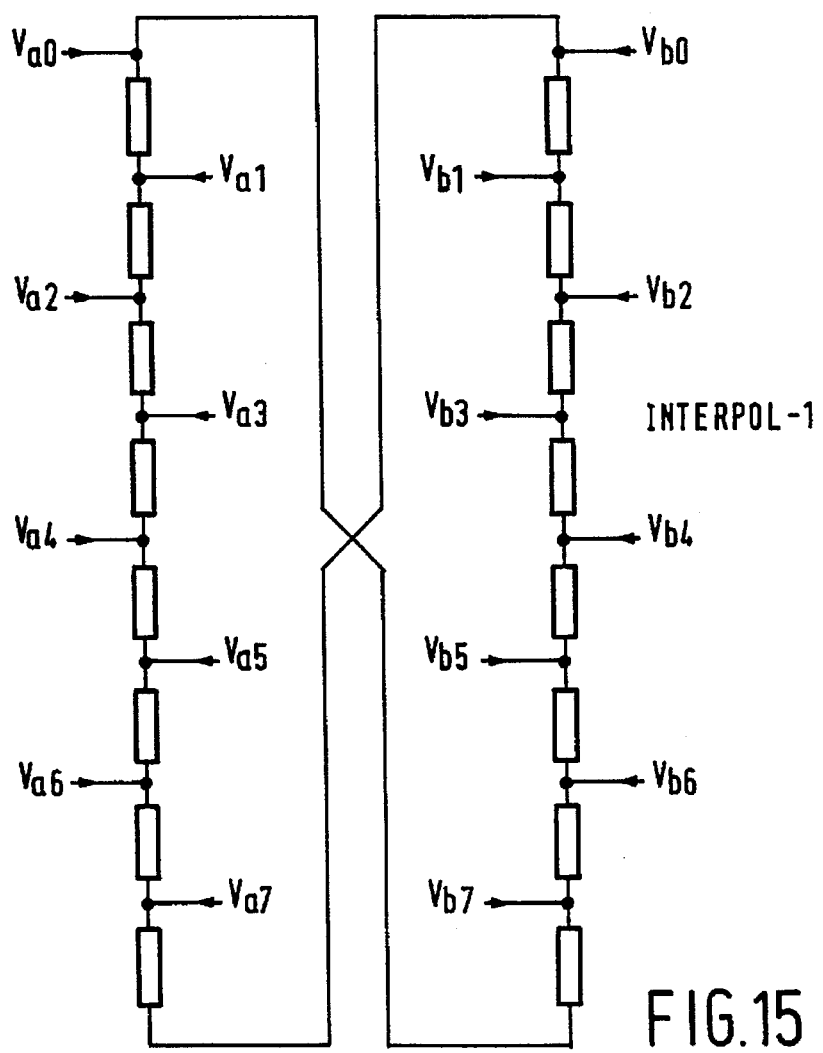
FIG. 15 shows an implementation of a two times interpolation network for use in a folding A/D converter according to the invention.

FIG. 15 shows an implementation of the first two times interpolation network INTERPOL-1 from FIG. 8. It consists of a string of equal resistors connected as indicated. The signal names are the same as in FIG. 8. The folding signals $V_{ai}$, $V_{bi}$, i=1, 3, 5 and 7, are generated by resistive interpolation:

$$V_{ai} = (V_{a(i-1)} + V_{a(i+1)})/2 \tag{10}$$

and $$V_{bi} = (V_{b(i-1)} + V_{b(i+1)})/2 \tag{11}$$

Folding signals $V_{a7}$ and $V_{b7}$, however, are obtained by interpolation of signals $V_{a6}$ and $V_{b6}$ cross-linked with signals $V_{a0}$ and $V_{b0}$. This means that the interpolation network is a closed ring: each folding signal has two adjacent folding signals.

Figure 16:
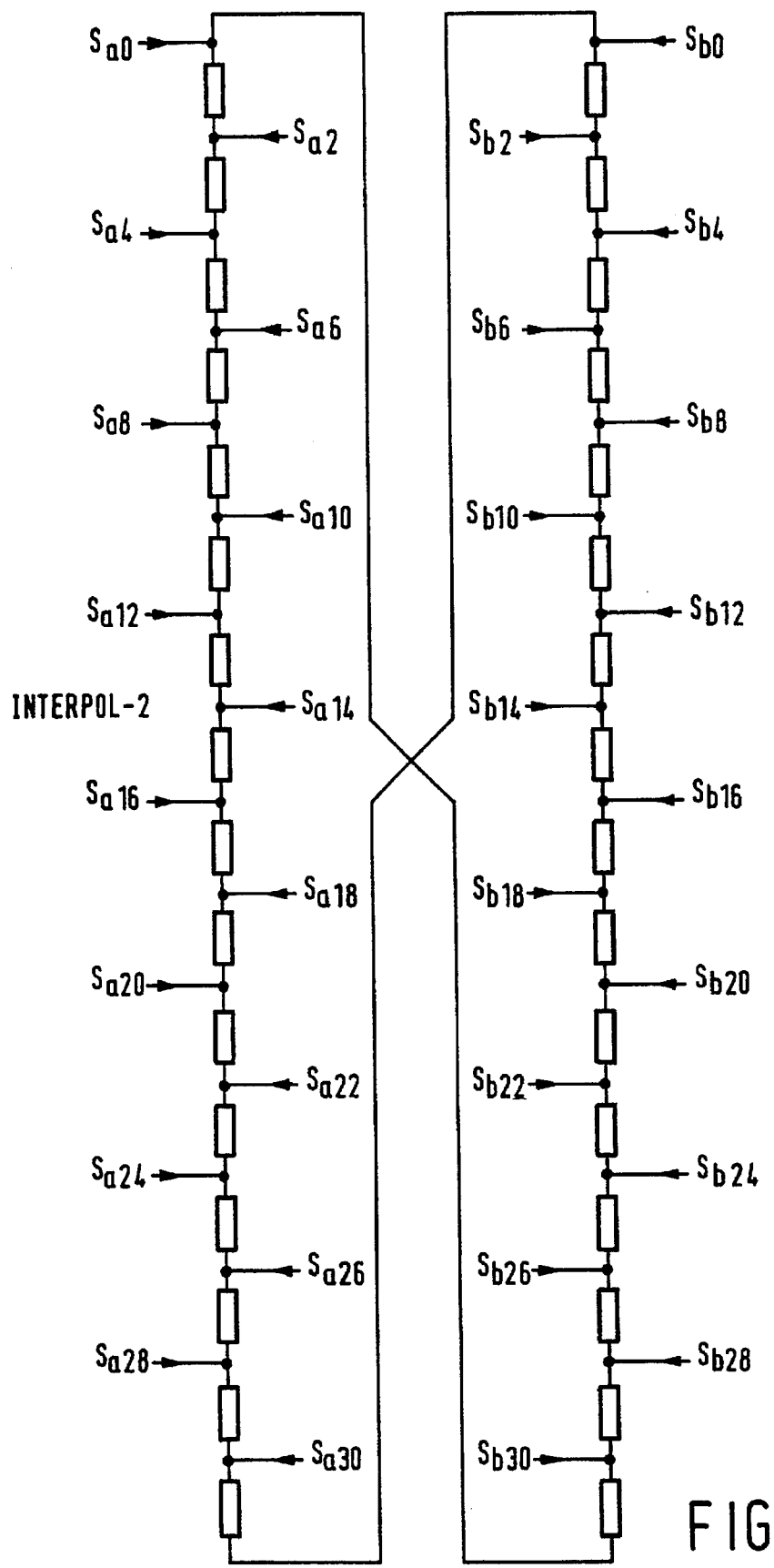
FIG. 16 shows an implementation of a four times interpolation network for use in a folding A/D converter according to the invention.

FIG. 16 shows an implementation of the second four times interpolation network INTERPOL-2 from FIG. 8. This network functions as described in section IX of the aforementioned citation R. van de Grift et al., "An 8-bit Video ADC Incorporating Folding and Interpolating Techniques", IEEE Journal of Solid-State Circuits, Vol. SC-22, No. 6, December 1987, pp 944–953. It is an improved interpolation network having a number of interpolation resistors which is decreased by a factor two compared to a conventional interpolation network like the INTERPOL-1 network. Sixteen folding signals $S_i$ with even i are generated according to the next formula:

$$S_i = S_{ai} - S_{bi} (i=0,2,4, \ldots 26,28,30) \tag{12}$$

Figure 17:
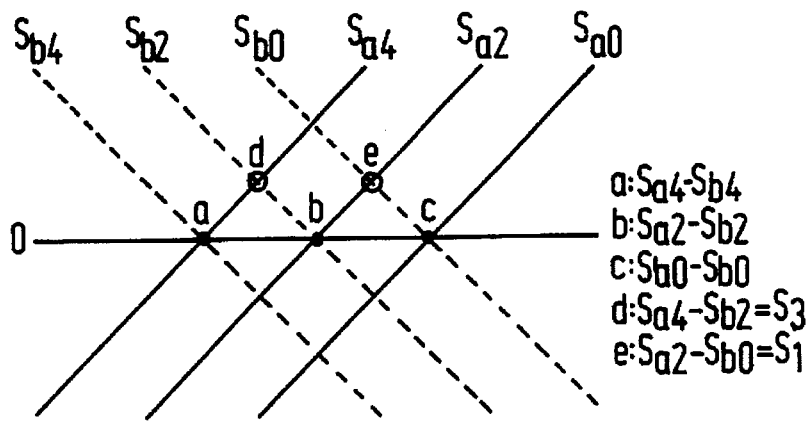
FIG. 17 shows the derivation of folding signals in the interpolation network of FIG. 16.

$S_i$ are the output signals of the amplifiers AMP-0, ... AMP-7 (FIG. 8). For i=2,6,10,14,18,22,26,30, $S_i$ are interpolated signals. The remaining set of 16 folding signals $S_i$ with odd i are derived from the INTERPOL-2 network as shown in FIG. 17. These folding signals satisfy the next expressions:

$$S_i = S_{a(i+1)} - S_{b(i-1)} (i=1,3,5, \ldots 27,29) \tag{13}$$

and $$S31 = S_{b0} - S_{b30} \tag{14}$$

Figure 18:
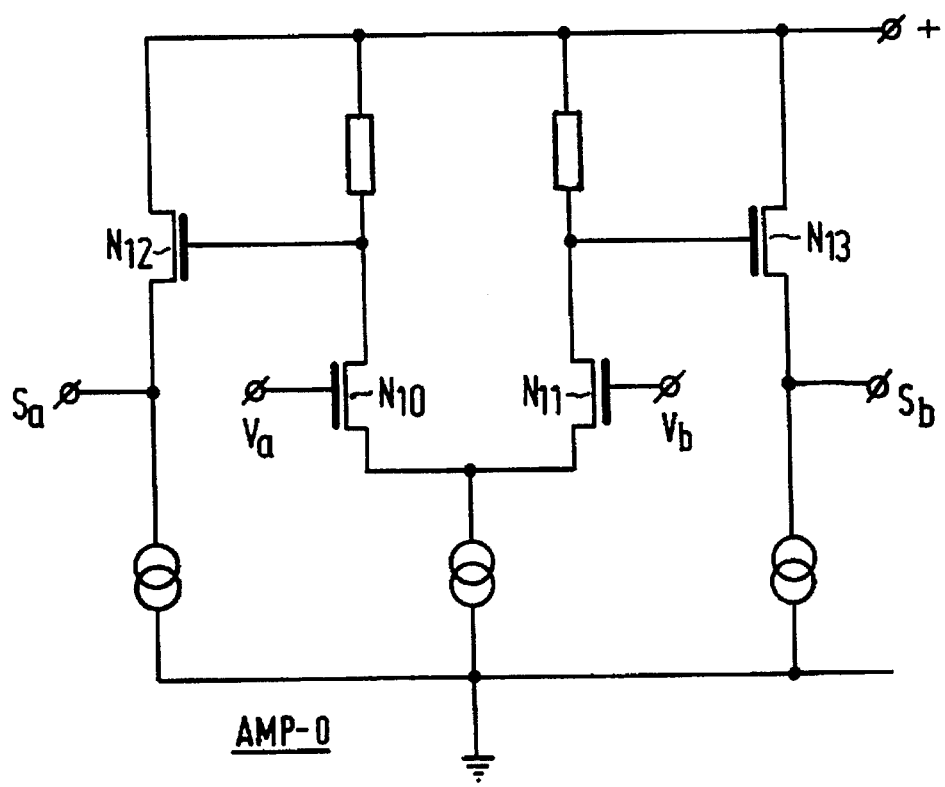
FIG. 18 shows a circuit diagram of an amplifier for use in the two stage interpolation system of FIG. 8.

The amplifiers AMP-0, ... ,AMP-7 of FIG. 8 may be of any suitable design, for instance as shown in FIG. 18. The amplifier has a differential N-channel transistor pair $N_{10}$, $N_{11}$ with interconnected sources and drains which are connected to respective drain resistors. The output voltages at the drains are buffered by sources followers $N_{12}$ and $N_{13}$.

We claim:

1. A folding stage for a folding analog-to-digital converter, the folding stage comprising:

an input terminal for receiving an input voltage to be folded;

reference means having a plurality of consecutive reference terminals for providing ascending different reference voltages;

a first summing node and a second summing node;

a plurality of differentially coupled transistor pairs, each one of the transistor pairs comprising a current source, a first transistor having a first main electrode coupled to the current source and a control electrode coupled to the input terminal and a second transistor having a first main electrode coupled to the current source and a control electrode coupled to a respective one of the consecutive reference terminals, the second main electrode of the first transistor of consecutive transistor pairs being coupled alternately to the first summing node and to the second summing node, and the second main electrode of the associated second transistor being coupled alternately to the second summing node and to the first summing node;

a first output node; and current-to-voltage converter means comprising a first resistor connected between the first summing node and the first output node to provide a first output voltage, and a transconductance stage having an inverting input coupled to the first summing node and an output coupled to the first output node.

2. A folding stage as claimed in claim 1, wherein the folding stage further comprises a first bias current source coupled to the first output node for providing a first bias current to the first summing node via the first resistor.

3. A folding stage as claimed in claim 2 wherein the folding stage further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node.

4. A folding stage as claimed in claim 3, wherein the folding stage further comprises a second bias current source coupled to the second output node for providing a second bias current to the second summing node via the second resistor.

5. A folding stage as claimed in claim 4, wherein the transconductance stage comprises a first transistor and a second transistor having first main electrodes coupled to a common current source, having respective second main electrodes coupled to the first output node and the second output node; respectively, and having respective control electrodes coupled to the first summing node and the second summing node, respectively.

6. A folding stage as claimed in claim 5, wherein the transconductance stage further comprises a third resistor connected between the first output node and the second summing node and a fourth resistor connected between the second output node and the first summing node.

7. A folding stage as claimed in claim 1, which further comprises a dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal a first main electrode connected to the second current source and a second main electrode coupled to the other of the first and second summing nodes.

8. A folding stage a claimed in claim 1, wherein in at least two of the plurality of differentially coupled transistor pairs the control electrode of the second transistor is coupled to a reference terminal supplying a reference voltage which lies outside the voltage range of the input voltage to be folded.

9. A folding analog-to-digital converter comprising:
an input terminal for receiving an input voltage to be converted;
reference means having a plurality of consecutive reference terminals for providing ascending different reference voltages;
a plurality of folding stages, each folding stage comprising:
a first summing node and a second summing node;
a plurality of differentially coupled transistor pairs, each one of the transistor pairs comprising a current source, a first transistor having a first main electrode coupled to the current source and a control electrode coupled to the input terminal and a second transistor having a first main electrode coupled to the current source and a control electrode coupled to a respective one of the consecutive reference terminals, the second main electrode of the first transistor of consecutive transistor pairs being coupled alternately to the first summing node and the second summing node, and the second main electrode of the associated second transistor being coupled alternately to the second summing node and the first summing node;
a first output node;
current-to-voltage converter means comprising a first resistor connected between the first summing node and the first output node to provide a first output voltage and having an input coupled the first summing node, and a transconductance stage having an inverting input coupled to the first summing node and an output coupled to the first output node;
and
a first interpolation network comprising a string of impedance elements interconnected in main string nodes, the main string nodes being connected to respective first output nodes of the folding stages, each one of the impedance elements being comprised of a substring of impedance elements interconnected in substring nodes for providing interpolated versions of voltages at the first output nodes.

10. A folding analog-to-digital converter as claimed in claim 9, wherein the folding stage further comprises a first bias current source coupled to the first output node for providing a first bias current to the first summing node via the first resistor.

11. A folding analog-to-digital converter as claimed in claim 10, wherein
the folding stage further comprises a second output node;
the current-to-voltage converter means further comprises a second resistor connected between the second output node and the second summing node to provide a second output voltage; and
the transconductance stage has a non-inverting input coupled to the second summing node and an inverting output coupled to the second output node.

12. A folding analog-to-digital converter as claimed in claim 11, wherein the folding stage further comprises a second bias current source coupled to the second output node for providing a second bias current to the second summing node via the second resistor.

13. A folding analog-to-digital converter as claimed in claim 11, wherein the first interpolation network comprises a further string of further impedance elements interconnected in further main string nodes, the further main string nodes being connected to respective second output nodes of the folding stages, each one of the further impedance elements being comprised of a further substring of further impedance elements interconnected in further substring nodes for providing interpolated versions of voltages at the second output nodes.

14. A folding analog-to-digital converter as claimed in claim 11, wherein the transconductance stage comprises a first transistor and a second transistor having first main electrodes coupled to a common current source, having second main electrodes coupled to the first output node and the second output node, respectively, and having respective control electrodes coupled to the first summing node and the second summing node, respectively.

15. A folding analog-to-digital converter as claimed in claim 14, wherein the transconductance stage further comprises a third resistor connected between the first output node and the second summing node and a fourth resistor connected between the second output node and the first summing node.

16. A folding analog-to-digital converter as claimed in claim 13, further comprising a second interpolation network comprising a string of impedance elements, interconnected in main nodes, each of the main nodes being connected to receive a selected one of the voltages at the first and second output nodes and the interpolated versions thereof, and each impedance element being comprised of a substring of impedance elements interconnected in substring nodes for providing interpolated versions of voltages received at the main nodes of the second interpolation network.

17. A folding analog-to-digital converter as claimed in claim 16, further comprising buffer amplifiers for coupling said selected ones of said voltages to the main nodes of the second interpolation network.

18. A folding analog-to-digital converter as claimed in claim 9 wherein the folding stage further comprises a dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal, a first main electrode connected to the second current source and a second main electrode coupled to the other of the first and second summing nodes.

19. A folding analog-to-digital converter as claimed in claim 9 wherein in at least two of the plurality of differentially coupled transistor pairs the control electrode of the second transistor is coupled to a reference terminal supplying a reference voltage which lies outside the voltage range of the input voltage to be folded.

20. A folding stage as claimed in claim 1 wherein the folding stage further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node.

21. A folding stage as claimed in claim 2, which further comprises a dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal, a first main electrode connected to the second current source and a second main electrode coupled to the other of the first and second summing nodes.

22. A folding analog-to-digital converter as claimed in claim 9, wherein the folding stage further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node.

23. A folding stage as claimed in claim 20, which further comprises a dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal, a first main electrode connected to the second current source and a second main electrode coupled to the other of the first and second summing nodes.

24. A folding stage as claimed in claim 2, wherein in at least two of the plurality of differentially coupled transistor pairs the control electrode of the second transistor is coupled to a reference terminal supplying a reference voltage which lies outside the voltage range of the input voltage to be folded.

* * * * *